United States Patent [19]

Grebinski

[11] Patent Number: 4,867,799
[45] Date of Patent: Sep. 19, 1989

[54] AMMONIUM VAPOR PHASE STRIPPING OF WAFERS

[75] Inventor: Thomas J. Grebinski, Sunnyvale, Calif.

[73] Assignee: Purusar Corporation, Sunnyvale, Calif.

[21] Appl. No.: 95,328

[22] Filed: Sep. 10, 1987

Related U.S. Application Data

[63] Continuation-in-part of Ser. No. 745,241, Jun. 13, 1985, Pat. No. 4,695,327.

[51] Int. Cl.$^4$ ................................................ B08B 5/00
[52] U.S. Cl. ...................................... 134/11; 134/36; 134/37; 437/229
[58] Field of Search ............... 134/11, 28, 30, 31, 134/36, 37, 41; 252/79.2; 437/229, 236, 238; 156/659.1

[56] References Cited

U.S. PATENT DOCUMENTS

| | | | |
|---|---|---|---|
| 3,727,620 | 4/1973 | Orr | 134/95 |
| 3,769,992 | 11/1973 | Wallestad | 134/153 |
| 4,264,374 | 4/1981 | Beyer et al. | 134/30 |
| 4,519,846 | 5/1985 | Aigo | 134/30 |
| 4,654,116 | 3/1987 | Spacer | 252/79.2 |
| 4,695,327 | 9/1987 | Grebinski | 134/11 |

Primary Examiner—Patrick P. Garvin
Assistant Examiner—George R. Fourson
Attorney, Agent, or Firm—Fliesler, Dubb, Meyer & Lovejoy

[57] ABSTRACT

A method is set forth of treating a surface of an object to remove impurities. The object is positioned within a treating chamber with the surface exposed. Ammonia vapor is contacted with water vapor and/or hydrogen peroxide vapor adjacent to the surface to provide a hot mixture comprising at least ammonia and ammonium hydroxide. The hot mixture is impinged on the surface. The contacting is immediately prior to and/or simultaneous with the impinging. Resist is quickly stripped from the surfaces of semiconductors by this method. And, the stripping is very complete. Group I and Group II metals are also removed.

8 Claims, 1 Drawing Sheet

AMMONIUM VAPOR PHASE STRIPPING OF WAFERS

CROSS-REFERENCE

This application is a continuation-in-part of co-pending application Ser. No. 745,241, filed June 13, 1985 now U.S. Pat. No. 4,695,327.

TECHNICAL FIELD

The invention is concerned with a method of treating a surface of an object to remove impurities. The method is particularly useful for treatment of the surfaces of semiconductor wafers to remove resist and Group I and Group II metals.

BACKGROUND ART

In the processing of wafers used in the manufacture of integrated circuits and the like, it is necessary in various processing steps to accomplish etching of certain areas of the wafer, to remove photoresist coating which may be applied to the wafer, and to otherwise clean the wafer. Prior art resist stripper processes are generally relatively slow, taking 30 to 60 minutes to remove the resist.

An apparatus which is directed toward these processing steps is disclosed in U.S. Pat. No. 3,990,462, issued to Elftmann, et al. As disclosed therein, wafers are disposed in cassettes which are in turn mounted on a rotary turntable. A central post defines a plurality of pairs of ports, each port being positioned to direct fluid therefrom onto an adjacent wafer as that wafer passes the port due to the rotary motion of the turntable. As disclosed in that patent, one port of each pair carries acid or water, while the other port carried gas, such as gaseous nitrogen, or air. Each pair of ports is positioned so that, with continuous fluid flow from that pair, an atomized fog-spray is provided to the wafer.

It will be understood that processing of such wafers must be done in an extremely even manner so that all parts of the wafer are processed properly and uniformly. This has been a problem in the type of apparatus disclosed in the above-cited patent. Furthermore, the processing of a wafer in such a system is relatively slow.

In U.S. Pat. No. 3,970,249 to Singer, secondary streams are alternatively applied to a stream of atomized particles by applying those particles to a substrate. The system thereof, however, is not applicable to processing semiconductor wafers, in particular the removal of material from a semiconductor wafer through etching, stripping or cleaning.

It is also known to utilize a semiconductor wafer processing apparatus which comprises a body defining first and second adjacent ports through which fluid may flow from the body, the ports being positioned so that fluid flow from the first port influences fluid flow from the second port, means for varying fluid flow from the first port, and means for supporting the wafer such that at least a portion of the fluid flow moves generally across a major surface of a so-supported wafer.

Of more general interest in this area are U.S. Pat. Nos. 3,769,992, to Wallestad and 3,727,620 to Orr.

Another process for cleaning semiconductor wafers is to contact them with a liquid solvent of the desired composition. The composition may be stirred or otherwise caused to flow across or against the surfaces of the wafers to provide somewhat of a washing action.

In the past, resist materials have been removed by utilizing one or more of the following: halogenated hydrocarbons, such as methylene chloride, sulfides such as dimethylsulfide, amines and their derivatives such as dimethylformamide, N-methyl-2-pyrrolidinone, glycol ethers such as ethylene glycol monomethyl ether, ethynol and the acetates thereof, ketones such as methyl ethyl ketone and acetone and materials such as isopropyl alcohol, sulfuric acid-hydrogen peroxide mixtures, ammonium persulfate and mixtures of caustic and phenol derivatives as well as by various other materials. Cleaning of the wafer utilizing such liquid solvents takes a good deal of time, often from 30 minutes to an hour residence time in a bath of the liquid.

Other methods of stripping resist include $O_2$ plasmas, U.V./ozone, plus combinations, e.g., two operative processes. First a plasma step and then a liquid acid dip is the most common practice and the only way to do a complete resist stripping job.

There are several drawbacks with the use of the aforementioned resist material removing compositions. One of the major disadvantages with the aforementioned methods of stripping resist is that they do not remove deep UV baked, implant-hardened or plasma-hardened photoresist, or they leave behind traces of resist film and non-dissolved yield limiting contaminants originating from the liquid stripping compositions. Other disadvantages are undesirable flammability, volatility, odor or toxicity, drainage of large quantities of possibly dangerous chemicals in city sewer systems and attack of underlying metal films. Additionally, such strippers are not effective against resist materials that are subject to a severe post baking operation thereby limiting their usefulness. A disadvantage in instances where plasmas or U.V./ozone is used is that particulates are formed which must be liquid acid stripped. The plasma systems of choice are very complex (involving complicated vacuum systems and automation) and are also quite expensive.

The present invention is directed to solving one or more of the problems as set forth above.

DISCLOSURE OF INVENTION

In accordance with the present invention, a method is set forth of treating a surface of an object to remove impurities. The treating method comprises positioning the object, with the surface exposed, within a treating chamber; contacting ammonia vapor with water vapor adjacent the surface to form a hot mixture of water, ammonia and ammonium hydroxide; and impinging the hot mixture on the surface, the contacting being immediately prior to and/or simultaneous with the impinging.

When one operates in accordance with the present invention, organic materials, including resists (photo-, electron-beam, etc.), and including hard UV baked and other particularly removal resistant resists, are extremely efficiently and quickly (generally in less than about 5 minutes, e.g., in about 30 seconds) stripped from wafers. And, the necessary components, ammonia and water, can be readily vaporized and floated to contact with one another adjacent the surface of the wafer whereby operation is both reasonably easy and inexpensive. Furthermore, the final waste product, ammonium hydroxide, can be readily disposed of, or consumed in other processes.

BRIEF DESCRIPTION OF THE DRAWINGS

The invention will be better understood by reference to the figures of the drawings wherein like numbers denote like parts throughout and wherein.

BEST MODE FOR CARRYING OUT THE INVENTION

Figure 1:
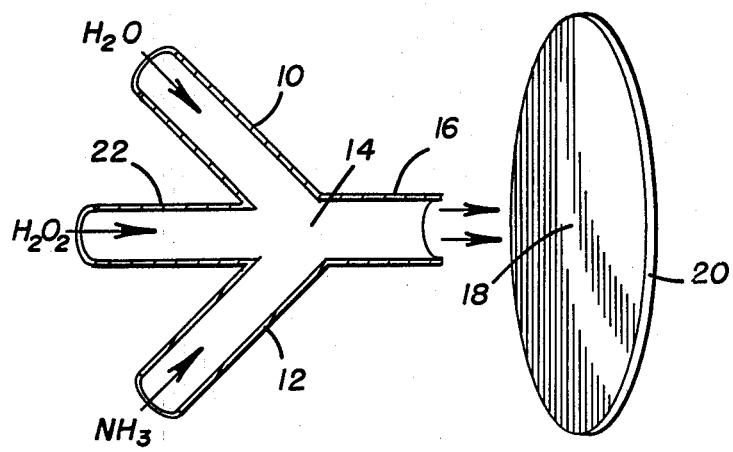
FIG. 1 illustrates, schematically, an embodiment in accordance with the present invention.

FIG. 1 illustrates an embodiment of the present invention wherein water via tube 10 is admixed with ammonia which enters via a tube 12 into a mixing chamber 14 and the resulting mixture proceeds via a tube 16 and therefrom is impelled, as illustrated by the arrows, onto a surface 18 of a semiconductor wafer 20, for example a silicon wafer. Hydrogen peroxide or an oxidizer such as oxygen may be introduced via a tube 22 to the mixing chamber 14 and, in accordance with the preferred embodiment of the present invention, is so introduced.

Figure 2:
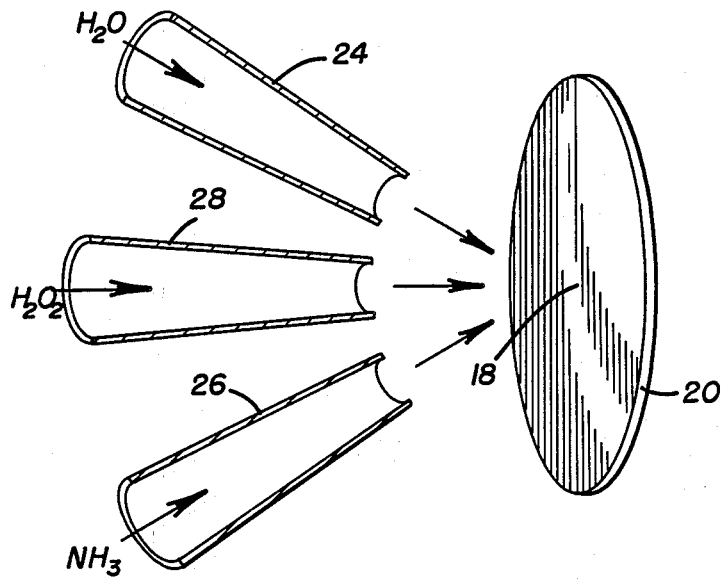
FIG. 2 illustrates, schematically, an alternate embodiment in accordance with the present invention.

FIG. 2 illustrates another embodiment of the present invention wherein the water, ammonia and hydrogen peroxide vapors are introduced respectively by individual tubes 24,16 and 28 and wherein the mixing occurs at the surface 18 of the wafer 20.

In operation it may be desirable to first impinge the ammonia alone onto the surface 18 of the wafer 20. This can provide an initial solvating action for resist materials and complexing of the Group I and Group II species which may be present. Generally the temperature of the water-ammonia mixture during impingement of the mixture upon the surface 18 of the wafer 20 will be from about 65° C. to about 185° C. Preferably the impinging is carried out at a temperature of at least about 100° C., said temperature being the temperature at the surface 18 of the wafer 20 rather than the general temperature within the chamber in which the stripping occurs.

It is very desirable in the present invention to include oxygen or hydrogen peroxide, preferably the latter, along with the ammonia and water. This greatly increases the cleansing ability of the mixture and also significantly increases the temperature of the mixture due to the exothermicity of mixing of hydrogen peroxide and ammonia.

A significant scrubbing action is provided by the direct impingment of the hot mixture on the surface 18 of the wafer 20. This serves to sweep away any particulate impurities as well as significantly improving the dissolution and reaction time with the resist.

The spent hydrogen peroxide, water and ammonia (generally in the form of ammonium hydroxide by then) falls to the bottom of the chamber in which the stripping is being carried out and can be readily disposed of.

Also in accordance with an embodiment of the present invention the hydrogen peroxide is used along with the ammonia in the absence of water. Again, very efficient stripping of photoresist results. The temperature of the resulting mixture is generally in the range from about 65° C. to about 185° C. although other temperatures can be used as well. Generally it is preferred that the temperature be above about 100° C.

It should be noted that ammonia is a gas having a boiling point below 0° C., and that water and hydrogen peroxide are easily vaporized having boiling points of 100° C. and about 152° C., respectively.

The preferred temperatures for the ammonia, the water and hydrogen peroxide gases are as follows: $H_2O_2$—(100°–110°) C., $H_2O$—(130°–165°) C. and $NH_3$ about 100° C. The impinging is generally carried out at a pressure which falls in a range from about ambient to about 15 PSIG, although the pressure is not critical.

The complete stripping of a hard baked resist layer from a surface 18 of a wafer 20 generally takes from about 30 seconds to about 300 seconds. In any event, it is usually completed in less than 5 minutes. Of course, longer times can be utilized but such is unnecessary.

It is further possible to utilize a mixture of hydrogen peroxide and water and to admix that mixture with ammonia. Again the reaction is exothermic and cleaning of the surface 18 of the wafer 20 is efficiently carried out.

Generally high pressure distilled water may be utilized, for example, introduced via the tube 10, to rinse off any residual cleaning chemicals from the surface 18 of the wafer 20.

The invention will be better understood by reference to the following example.

EXAMPLE

Referring to FIG. 1, hydrogen peroxide, water, and ammonia, the hydrogen peroxide at a source temperature of 110° C., the water source at a temperature of 130° C. and the ammonia at a temperature of about 100° C., are flowed through tubes 10 and 12 and mixed in chamber 14, and then the resulting hot mixture flows through tube 16 and impinges upon the surface 18 of a silicon wafer 20. A thermometer is in the reaction chamber, which is seated, near the stream exiting the tube but not in that stream. The surface 18 of the wafer 20 has a hard-baked resist layer on it which has been hard-baked by heating it at 190° C. for 30 minutes. The combined hydrogen peroxide, water, ammonia stream is impinged on the surface 18 of the wafer 20 for approximately 180 seconds. At the end of this time, flow is ceased other than flow of the water vapor, which continues for an additional 300 seconds. The wafer is then dried with ionized dry nitrogen for an additional 300 seconds. The wafer on removal from the reaction chamber is completely free of photoresist. The complete reaction conditions are as follows: mass flow ratio of hydrogen peroxide, water and ammonia vapors=1:5:5, pressure of water vapor 30 psig, and pressure of ammonia 15 psig. Hydrogen peroxide is bubbled in to the reaction chamber through a quartz bubbler capable of delivering the proper mass flow at a bubbler pressure of 10 psig. The thermometer during the 300 seconds shows a reading in the range of 65° to 185° C.

INDUSTRIAL APPLICABILITY

The present invention provides very high speed cleaning of photoresist and Group I and Group II metals from the surfaces 18 of semiconductor wafers 20.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

I claim:

1. A method of treating a surface of an object to remove impurities, comprising:

positioning the object, with the surface exposed, within a sealed treating chamber;

contacting ammonia vapor with hydrogen peroxide vapor and/or water vapor adjacent said surface to provide a hot mixture comprising at least ammonia, water and ammonium hydroxide; and impinging said hot mixture on said surface at a sufficient velocity to provide a scrubbing action to dislodge any particulate materials, said contacting being immediately prior to and/or simultaneous with said impinging.

2. A method as set forth in claim 1, wherein said contacting is of ammonia with water.

3. A method as set forth in claim 1, wherein said contacting is of ammonia with hydrogen peroxide.

4. A method as set forth in claim 1, wherein said contacting is of water, ammonia and hydrogen peroxide.

5. A method as set forth in claim 4, wherein said water and hydrogen peroxide are premixed prior to being contacted with said ammonia.

6. A method as set forth in claim 1, wherein said impinging is at a temperature above about 65° C.

7. A method as set forth in claim 1, wherein said impinging is at a temperature above about 100° C.

8. A method as set forth in claim 5, wherein said impinging is at a temperature above about 100° C.

* * * * *